US010896903B2

(12) United States Patent
Sai

(10) Patent No.: US 10,896,903 B2
(45) Date of Patent: Jan. 19, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Hideaki Sai, Ibo Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 14 days.

(21) Appl. No.: 16/255,970

(22) Filed: Jan. 24, 2019

(65) Prior Publication Data

US 2020/0091134 A1  Mar. 19, 2020

(30) Foreign Application Priority Data

Sep. 14, 2018  (JP) ................. 2018-173127

(51) Int. Cl.
   *H01L 27/02*   (2006.01)
   *H01L 29/36*   (2006.01)
   *H01L 29/87*   (2006.01)

(52) U.S. Cl.
   CPC .......... *H01L 27/0248* (2013.01); *H01L 29/36* (2013.01); *H01L 29/87* (2013.01)

(58) Field of Classification Search
   CPC ...... H01L 27/0248; H01L 29/36; H01L 29/87
   USPC ....................................................... 257/109
   See application file for complete search history.

(56) References Cited

U.S. PATENT DOCUMENTS

| 5,861,639 A * | 1/1999 | Bernier ............... H01L 29/7404 257/112 |
| 6,110,763 A * | 8/2000 | Temple ............. H01L 21/26513 438/133 |
| 2002/0066929 A1* | 6/2002 | Voldman ............. H01L 27/0251 257/355 |
| 2004/0217425 A1* | 11/2004 | Brodsky ............. H01L 27/0248 257/360 |

(Continued)

FOREIGN PATENT DOCUMENTS

| JP | H05-055554 A | 3/1993 |
| JP | 2003-282889 A | 10/2003 |
| JP | 2005-079287 A | 3/2005 |

*Primary Examiner* — Dzung Tran
(74) *Attorney, Agent, or Firm* — White & Case LLP

(57) ABSTRACT

A semiconductor device according to an embodiment includes a semiconductor layer having first and second plane, a first conductivity-type first semiconductor region, a second conductivity-type second semiconductor region between the first semiconductor region and the first plane, a first conductivity-type third semiconductor region between the second semiconductor region and the first plane, a second conductivity-type fourth semiconductor region between the third semiconductor region and the first plane, a first conductivity-type fifth semiconductor region provided between the first semiconductor region and the first plane, a first electrode provided on a side of the first plane, and electrically connected to the third semiconductor region and the fourth semiconductor region, a second electrode provided on a side of the second plane, and electrically connected to the first semiconductor region, and a conductive layer provided on a side of the first plane, and electrically connecting the second and the fifth semiconductor region.

9 Claims, 3 Drawing Sheets

(56) References Cited

U.S. PATENT DOCUMENTS

| | | | |
|---|---|---|---|
| 2007/0120193 A1* | 5/2007 | Inoue | H01L 27/0255 257/358 |
| 2008/0173894 A1* | 7/2008 | Inoue | H01L 27/0262 257/173 |
| 2010/0001783 A1* | 1/2010 | Ronsisvalle | H01L 29/742 327/438 |
| 2016/0276332 A1* | 9/2016 | Laine | H01L 29/861 |

* cited by examiner

US 10,896,903 B2

SEMICONDUCTOR DEVICE

CROSS-REFERENCE TO RELATED APPLICATION

This application is based upon and claims the benefit of priority from Japanese Patent Application No. 2018-173127, filed on Sep. 14, 2018, the entire contents of which are incorporated herein by reference.

FIELD

Embodiments described herein relate generally to a semiconductor device.

BACKGROUND

Electrostatic discharge (ESD) is a phenomenon in which a current instantaneously flows when two objects such as a human body and an electronic device come in contact with each other. An ESD protection diode is used to protect the electronic device from a surge current caused by intrusion of the ESD into the electronic device.

The ESD protection diode is connected between, for example, a signal line connected to a device to be protected and the ground. When ESD is applied to the signal line, most of the surge current flows into the ground via the ESD protection diode, and a part of the surge current flows into the device to be protected as a residual current.

With the advancement of scaling-down of the device to be protected, further reduction of the residual current flowing in the device to be protected is required. To reduce the residual current, reduction of a clamp voltage and a dynamic resistance of the ESD protection diode is necessary. The clamp voltage is a voltage generated between terminals of the ESD protection diode when the surge current is flowing through the ESD protection diode. The dynamic resistance is a resistance between both the terminals of the ESD protection diode when the surge current is flowing through the ESD protection diode.

DETAILED DESCRIPTION

Figure 1:
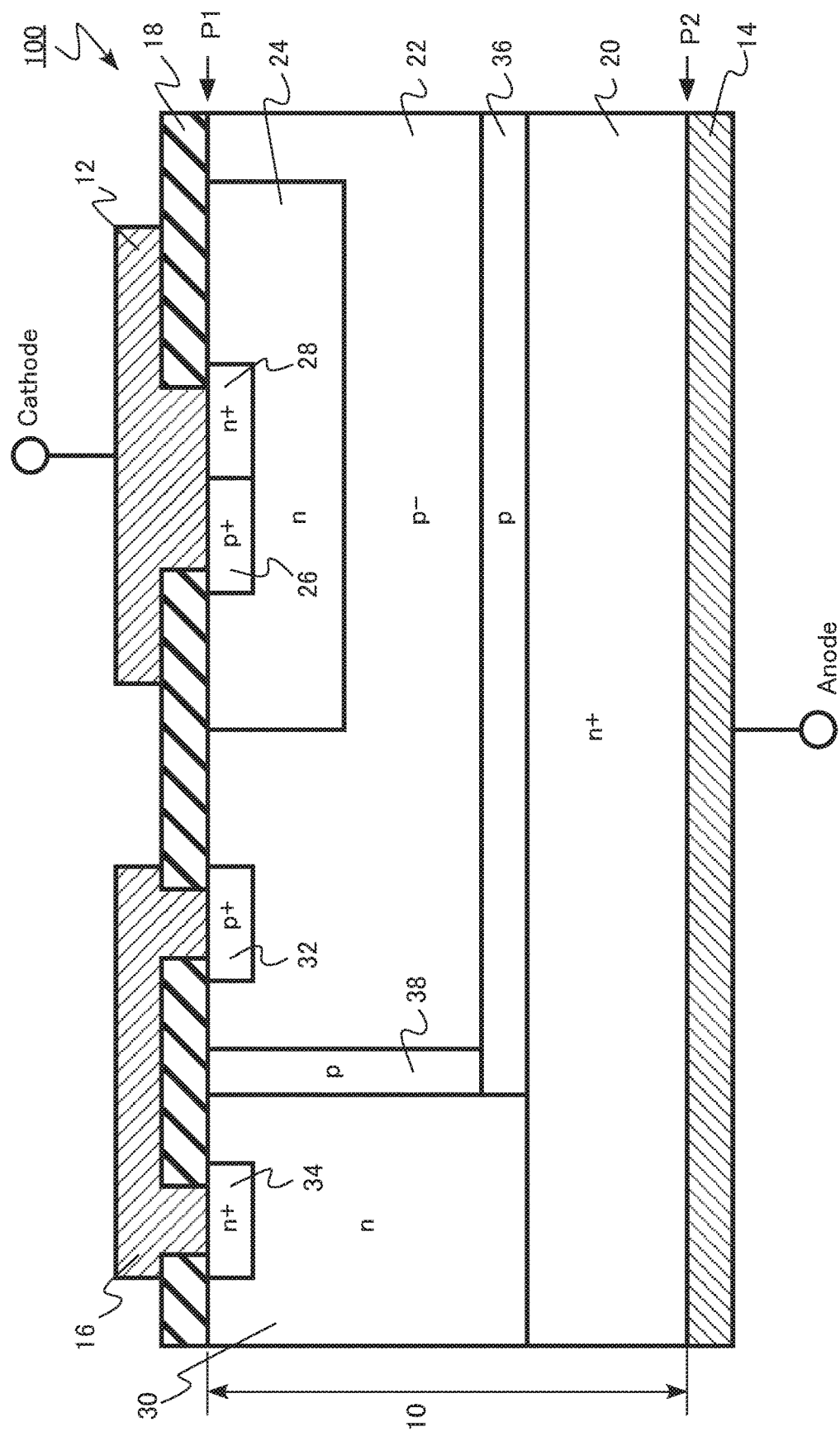
FIG. 1 is a schematic sectional view of a semiconductor device according to a first embodiment.

In the present specification, the same or similar members are denoted by the same reference numerals, and redundant description may be omitted.

Further, in the following description, notation of $n^+$, n, $n^-$ and $p^+$, p, $p^-$ may be used. This notation expresses relative high and low levels of impurity concentration in each conductivity type. That is, this notation indicates that an n-type impurity concentration is relatively higher in $n^+$ than in $n^-$ and the n-type impurity concentration is relatively lower in $n^-$ than in n. Further, this notation indicates that a p-type impurity concentration is relatively higher in $p^+$ than in p, and the p-type impurity concentration is relatively lower in $p^-$ than in p. Note that the $n^+$-type and $n^-$-type are sometimes simply described as n-type, and $p^+$-type and $p^-$-type are sometimes simply described as p-type.

The impurity concentration can be measured by secondary ion mass spectrometry (SIMS), for example. Further, the relative high and low levels of the impurity concentration can also be determined from high and low levels of a carrier concentration obtained by scanning capacitance microscopy (SCM), for example. Further, distances such as the depth and thickness of an impurity region can be obtained by SIMS, for example. Further, distances such as the depth, thickness, width, and interval of an impurity region can be obtained from an SCM image or a composite image of the SCM image and an atomic force microscope (AFM) image, for example.

First Embodiment

A semiconductor device according to a first embodiment includes a semiconductor layer having a first plane and a second plane; a first semiconductor region of a first conductivity-type provided in the semiconductor layer; a second semiconductor region of a second conductivity-type provided in the semiconductor layer, and the second semiconductor region located between the first semiconductor region and the first plane; a third semiconductor region of the first conductivity-type provided in the semiconductor layer, the third semiconductor region located between the second semiconductor region and the first plane, and the third semiconductor region having a lower first conductivity-type impurity concentration than the first semiconductor region; a fourth semiconductor region of the second conductivity-type provided in the semiconductor layer, the fourth semiconductor region located between the third semiconductor region and the first plane, and the fourth semiconductor region having a higher second conductivity-type impurity concentration than the second semiconductor region; a fifth semiconductor region of the first conductivity-type provided in the semiconductor layer, the fifth semiconductor region provided between the first semiconductor region and the first plane, and the second semiconductor region being interposed between the fifth semiconductor region and the third semiconductor region; a first electrode provided on a side of the first plane of the semiconductor layer, and the first electrode electrically connected to the third semiconductor region and the fourth semiconductor region; a second electrode provided on a side of the second plane of the semiconductor layer, and the second electrode electrically connected to the first semiconductor region; and a conductive layer provided on a side of the first plane of the semiconductor layer, and the conductive layer electrically connecting the second semiconductor region and the fifth semiconductor region.

FIG. 1 is a schematic sectional view of a semiconductor device according to the first embodiment.

The semiconductor device according to the first embodiment is an ESD protection diode 100. The ESD protection diode 100 includes a thyristor structure.

Hereinafter, a case where first-conductivity type is n type and second-conductivity type is p type will be described as an example.

The ESD protection diode 100 includes a semiconductor layer 10, a cathode electrode 12 (first electrode), an anode electrode 14 (second electrode), a wiring layer 16 (conductive layer), and a protective insulating layer 18.

In the semiconductor layer 10, an $n^+$-type substrate region 20 (first semiconductor region), a $p^-$-type anode region 22 (second semiconductor region), an n-type cathode region 24

(third semiconductor region), a p⁺-type first contact region 26 (fourth semiconductor region), an n⁺-type second contact region 28, an n-type connection region 30 (fifth semiconductor region), a p⁺-type third contact region 32, an n⁺-type fourth contact region 34, a p-type first barrier region 36 (sixth semiconductor region), and a p-type second barrier region 38 (seventh semiconductor region) are provided.

The semiconductor layer 10 has a first plane (P1 in FIG. 1) and a second plane (P2 in FIG. 1) which facing the first plane P1. The first plane P1 is a surface of the semiconductor layer 10 and the second plane P2 is a back surface of the semiconductor layer 10.

The semiconductor layer 10 is, for example, a single crystal of silicon (Si). The first plane P1 is, for example, a (001) face of silicon.

The n⁺-type substrate region 20 is an impurity region containing an n-type impurity. The substrate region 20 is provided in contact with the second plane P2.

The substrate region 20 contains, for example, phosphorus (P), arsenic (As), or antimony (Sb) as the n-type impurity. The n-type impurity concentration of the substrate region 20 is, for example, equal to or higher than $5 \times 10^{19}$ cm$^{-3}$ and equal to or lower than $5 \times 10^{21}$ cm$^{-3}$.

The thickness of the substrate region 20 in a direction from the first plane P1 toward the second plane P2 is, for example, from 50 µm to 150 µm, both inclusive.

The p⁻-type anode region 22 is located between the substrate region 20 and the first plane P1. A part of the anode region 22 is in contact with the first plane P1.

The anode region 22 contains, for example, boron (B) as a p-type impurity. The p-type impurity concentration of the anode region 22 is, for example, equal to or higher than $5 \times 10^{12}$ cm$^{-3}$ and equal to or lower than $1 \times 10^{14}$ cm$^{-3}$.

The thickness of the anode region 22 in a direction from the first plane P1 toward the second plane P2 is, for example, equal to or higher than 5 µm and equal to or lower than 20 µm, both inclusive.

The anode region 22 is, for example, an epitaxial layer formed on the substrate region 20 by an epitaxial growth method.

The n-type cathode region 24 is located between the anode region 22 and the first plane P1. A part of the cathode region 24 is in contact with the first plane P1.

The cathode region 24 contains, for example, phosphorus (P) or arsenic (As) as the n-type impurity. The n-type impurity concentration of the cathode region 24 is lower than the n-type impurity concentration of the substrate region 20. The n-type impurity concentration of the cathode region 24 is, for example, equal to or higher than $5 \times 10^{15}$ cm$^{-3}$ and equal to or lower than $1 \times 10^{19}$ cm$^{-3}$.

The p⁺-type first contact region 26 is located between the cathode region 24 and the first plane P1. A part of the first contact region 26 is in contact with the first plane P1.

The first contact region 26 contains, for example, boron (B) as the p-type impurity. The p-type impurity concentration of the first contact region 26 is higher than the p-type impurity concentration of the anode region 22. The p-type impurity concentration of the first contact region 26 is, for example, equal to or higher than $5 \times 10^{19}$ cm$^{-3}$ and equal to or lower than $5 \times 10^{21}$ cm$^{-3}$.

The n⁺-type second contact region 28 is located between the cathode region 24 and the first plane P1. A part of the second contact region 28 is in contact with the first plane P1.

The second contact region 28 contains, for example, phosphorus (P) or arsenic (As) as the n-type impurity. The n-type impurity concentration of the second contact region 28 is higher than the n-type impurity concentration of the cathode region 24. The n-type impurity concentration of the second contact region 28 is, for example, equal to or higher than $5 \times 10^{19}$ cm$^{-3}$ and equal to or lower than $5 \times 10^{21}$ cm$^{-3}$.

The n-type connection region 30 is located between the substrate region 20 and the first plane P1. The connection region 30 is in contact with the substrate region 20. A part of the connection region 30 is in contact with the first plane P1. The connection region 30 sandwiches the anode region 22 with the cathode region 24.

The connection region 30 contains, for example, phosphorus (P) or arsenic (As) as the n-type impurity. The n-type impurity concentration of the connection region 30 is lower than the n-type impurity concentration of the substrate region 20. The n-type impurity concentration of the connection region 30 is, for example, equal to or higher than $5 \times 10^{16}$ cm$^{-3}$ and equal to or lower than $5 \times 10^{19}$ cm$^{-3}$.

The connection region 30 is formed, for example, by ion-implanting the n-type impurity into the semiconductor layer 10.

The p⁺-type third contact region 32 is located between the anode region 22 and the first plane P1. The third contact region 32 is in contact with the first plane P1.

The third contact region 32 contains, for example, boron (B) as the p-type impurity. The p-type impurity concentration of the third contact region 32 is higher than the p-type impurity concentration of the anode region 22. The p-type impurity concentration of the third contact region 32 is, for example, equal to or higher than $5 \times 10^{19}$ cm$^{-3}$ and equal to or lower than $5 \times 10^{21}$ cm$^{-3}$.

The n⁺-type fourth contact region 34 is located between the connection region 30 and the first plane P1. The fourth contact region 34 is in contact with the first plane P1.

The fourth contact region 34 contains, for example, phosphorus (P) or arsenic (As) as the n-type impurity. The n-type impurity concentration of the fourth contact region 34 is higher than the n-type impurity concentration of the connection region 30. The n-type impurity concentration of the fourth contact region 34 is, for example, equal to or higher than $5 \times 10^{19}$ cm$^{-3}$ equal to or lower than $5 \times 10^{21}$ cm$^{-3}$.

The p-type first barrier region 36 is provided between the substrate region 20 and the p⁻-type anode region 22. The first barrier region 36 is in contact with the substrate region 20. The first barrier region 36 is in contact with the p⁻-type anode region 22.

The first barrier region 36 contains, for example, boron (B) as the p-type impurity. The p-type impurity concentration of the first barrier region 36 is higher than the p-type impurity concentration of the anode region 22. The p-type impurity concentration of the first barrier region 36 is, for example, equal to or higher than $5 \times 10^{14}$ cm$^{-3}$ and equal to or lower than $5 \times 10^{18}$ cm$^{-3}$, both inclusive.

The p-type second barrier region 38 is provided between the connection region 30 and the anode region 22. The second barrier region 38 is in contact with the connection region 30. The second barrier region 38 is in contact with the anode region 22. The second barrier region 38 is located between the substrate region 20 and the first plane P1.

The second barrier region 38 contains, for example, boron (B) as the p-type impurity. The p-type impurity concentration of the second barrier region 38 is higher than the p-type impurity concentration of the anode region 22. The p-type impurity concentration of the second barrier region 38 is, for example, equal to or higher than $5 \times 10^{14}$ cm$^{-3}$ equal to or lower than $5 \times 10^{13}$ cm$^{-3}$.

The protective insulating layer 18 is provided on the first plane P1 of the semiconductor layer 10. The protective insulating layer 18 contains, for example, silicon oxide.

The cathode electrode 12 is provided on the side of the first plane P1 of the semiconductor layer 10. The cathode electrode 12 is provided on the first plane P1 of the semiconductor layer 10.

The cathode electrode 12 is electrically connected to the cathode region 24, the first contact region 26, and the second contact region 28. The cathode electrode 12 is in contact with the first contact region 26 and the second contact region 28.

The cathode electrode 12 is, for example, a metal. The cathode electrode 12 contains, for example, aluminum or an aluminum alloy. A portion of the cathode electrode 12, the portion being in contact with the semiconductor layer 10, is provided with, for example, a barrier metal layer. The barrier metal layer contains, for example, titanium, titanium nitride, or tungsten nitride.

The anode electrode 14 is provided on the side of the second plane P2 of the semiconductor layer 10. The anode electrode 14 is in contact with the second plane P2 of the semiconductor layer 10.

The anode electrode 14 is electrically connected to the substrate region 20. The anode electrode 14 is in contact with the substrate region 20.

The anode electrode 14 is, for example, a metal. The anode electrode 14 contains, for example, gold, silver, or a tin alloy.

The wiring layer 16 is provided on the side of the first plane P1 of the semiconductor layer 10. The wiring layer 16 electrically connects the anode region 22 and the connection region 30. The wiring layer 16 is in contact with, for example, the third contact region 32. The wiring layer 16 is in contact with, for example, the fourth contact region 34.

The wiring layer 16 is, for example, a metal. The wiring layer 16 contains, for example, aluminum or an aluminum alloy. A portion of the wiring layer 16, the portion being in contact with the semiconductor layer 10, is provided with, for example, a barrier metal layer. The barrier metal layer contains, for example, titanium, titanium nitride, or tungsten nitride.

The ESD protection diode 100 according to the first embodiment includes a pnpn-type thyristor structure formed of the $p^+$-type first contact region 26, the n-type cathode region 24, the $p^-$-type anode region 22, and the $n^+$-type substrate region 20.

Next, function and effect of the semiconductor device according to the first embodiment will be described.

The ESD protection diode is connected between, for example, a signal line connected to a device to be protected and the ground. When ESD is applied to the signal line, most of a surge current flows into the ground via the ESD protection diode, and a part of the surge current flows into the device to be protected as a residual current.

With the advancement of scaling-down of the device to be protected, further reduction of the residual current flowing in the device to be protected is required. To reduce the residual current, reduction of a clamp voltage and a dynamic resistance of the ESD protection diode is necessary.

To reduce the clamp voltage, a thyristor structure that snaps back to a low voltage is applied to the ESD protection diode, for example. For example, an n-type impurity region and a p-type impurity region are formed on the side of the first plane P1 of the semiconductor layer 10 having the first plane P1 and the second plane P2, that is, on the surface of the semiconductor layer. Thereby, the pnpn-type thyristor structure is provided. In this case, the ESD protection diode is a lateral device having both the cathode electrode and the anode electrode provided on the surface of the semiconductor layer.

In the case of a lateral device, a current path between the cathode electrode and the anode electrode is limited to the vicinity of the surface of the semiconductor layer. Therefore, reduction of the dynamic resistance of the ESD protection diode is difficult.

In the case of a lateral device, for example, forming the cathode electrode and the anode electrode into comb-shaped electrodes to expand the current path is conceivable. However, to form the comb-shaped electrodes in a limited chip area, scaling-down processing is required and chip cost may increase.

Further, Chip LGA to which the lateral device having the cathode electrode and the anode electrode provided on the surface can be easily mounted is applied to a package of the lateral device. In Chip LGA, the package size and the chip size are equal.

From the viewpoint of facilitation of mount to an electronic device or the like, the package size requires a predetermined size. In the case of Chip LGA, there is a possibility that the chip size cannot be reduced due to the demand for the package size, even if reduction of the chip size is possible. In this case, reduction of the chip cost is difficult.

Figure 2:
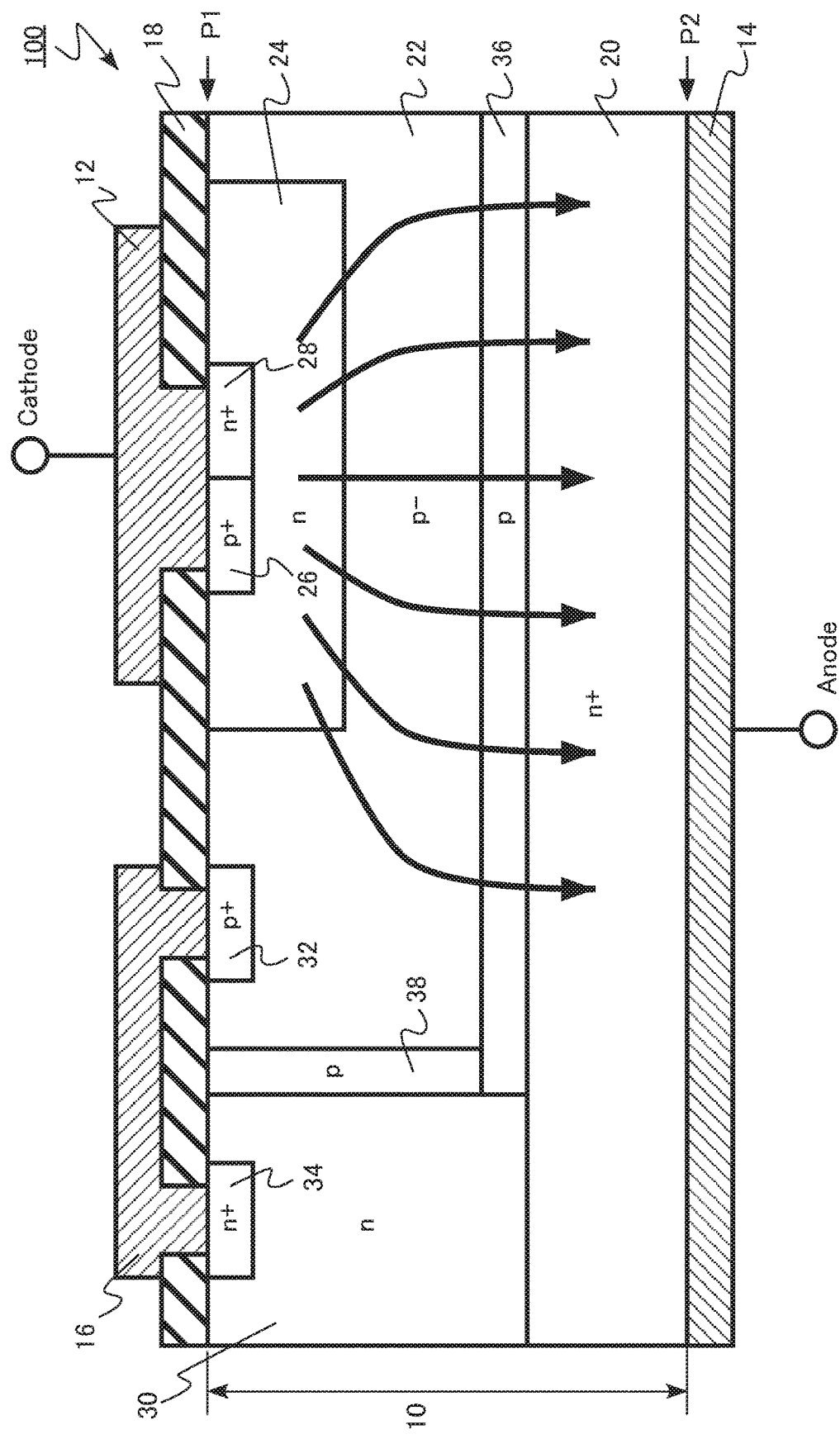
FIG. 2 is an explanatory diagram of function and effect of the semiconductor device according to the first embodiment.

FIG. 2 is an explanatory diagram of function and effect of the semiconductor device according to the first embodiment. FIG. 2 is a schematic diagram of the current path when the surge current flows through the ESD protection diode 100 of the first embodiment. The solid line arrows in the figure illustrate the current.

The ESD protection diode 100 is a vertical device in which the cathode electrode 12 is provided on the surface of the semiconductor layer 10 and the anode electrode 14 is provided on the back surface of the semiconductor layer 10. With the vertical device, the inside of the semiconductor layer 10 can be spaciously used as the current path. Therefore, reduction of the dynamic resistance of the ESD protection diode 100 becomes possible.

In addition, with the vertical device, a mold package can be applied to the package of the ESD protection diode 100. The anode electrode 14 on the back surface of the chip is bonded on a lead frame and wire bonding is performed on the cathode electrode 12 on the surface of the chip to mount the ESD protection diode 100 in the mold package.

With the facilitation of the mounting to the mold package, the restriction on chip size reduction due to the package size is eliminated. Therefore, the chip size can be reduced and the chip cost can be reduced.

Further, in the ESD protection diode 100, the wiring layer 16 for electrically connecting the anode region 22 and the connection region 30 is provided on the front surface side of the semiconductor layer 10. Therefore, it is not necessary to form a pattern on the back side of the semiconductor layer 10. Therefore, the manufacturing becomes easy and the chip cost can be reduced.

In the ESD protection diode 100, it is favorable to provide the p-type first barrier region 36 between the $n^+$-type substrate region 20 and the $p^-$-type anode region 22. With the provision of the first barrier region 36, a leakage current in a state where the surge current does not flow is suppressed.

In addition, in the ESD protection diode 100, it is favorable to provide the p-type second barrier region 38 between the n-type connection region 30 and the $p^-$-type anode region 22. With the provision of the second barrier region 38, a leakage current in a state where the surge current does not flow is suppressed.

As described above, according to the first embodiment, an ESD protection diode capable of reducing a dynamic resistance can be realized. Further, an ESD protection diode capable of reducing the chip cost can be realized. Further, an ESD protection diode with a suppressed leakage current can be realized.

Second Embodiment

A semiconductor device according to a second embodiment includes a semiconductor layer having a first plane and a second plane; a first semiconductor region of a first conductivity-type provided in the semiconductor layer; a second semiconductor region of a second conductivity-type provided in the semiconductor layer, and the second semiconductor region located between the first semiconductor region and the first plane; a third semiconductor region of the first conductivity-type provided in the semiconductor layer, the third semiconductor region located between the second semiconductor region and the first plane, and the third semiconductor region having a lower first conductivity-type impurity concentration than the first semiconductor region; a fourth semiconductor region of the second conductivity-type provided in the semiconductor layer, the fourth semiconductor region located between the third semiconductor region and the first plane, and the fourth semiconductor region having a higher second conductivity-type impurity concentration than the second semiconductor region; a conductor provided in the semiconductor layer, the conductor provided between the first semiconductor region and the first plane, and the conductor being in contact with the first semiconductor region; an insulating layer provided between the conductor and the semiconductor layer; a first electrode provided on a side of the first plane of the semiconductor layer, and the first electrode electrically connected to the third semiconductor region and the fourth semiconductor region; a second electrode provided on a side of the second plane of the semiconductor layer, and the second electrode electrically connected to the first semiconductor region; and a conductive layer provided on the side of the first plane of the semiconductor layer, and the conductive layer electrically connecting the second semiconductor region and the conductor.

The semiconductor device of the second embodiment is different from the semiconductor device of the first embodiment in including a conductor provided between the first semiconductor region and the first plane and being in contact with the first semiconductor region, and the insulating layer provided between the conductor and the semiconductor layer. Hereinafter, description of content overlapping with the first embodiment may be omitted.

Figure 3:
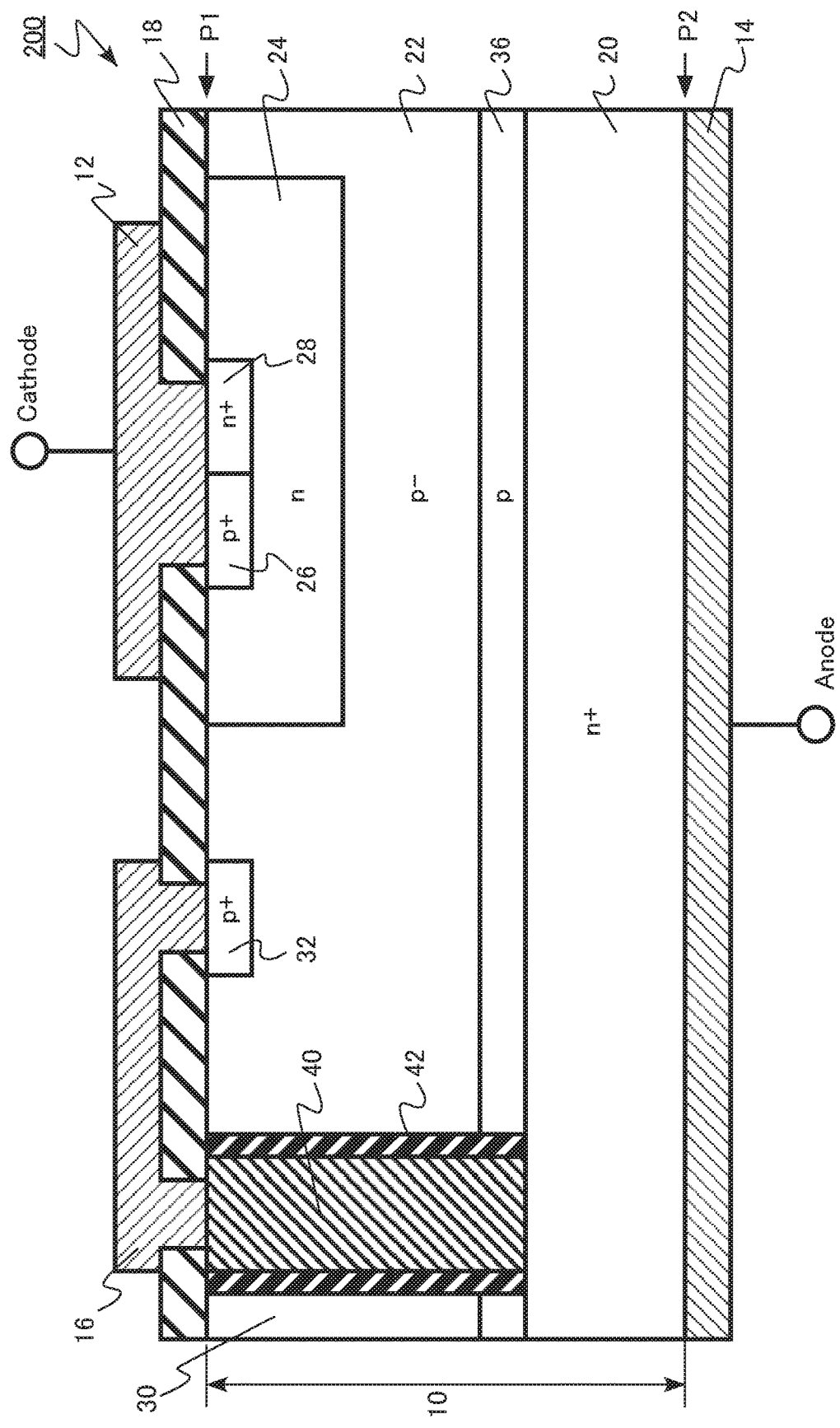
FIG. 3 is a schematic sectional view of a semiconductor device according to a second embodiment.

FIG. 3 is a schematic sectional view of the semiconductor device according to the second embodiment.

The semiconductor device according to the second embodiment is an ESD protection diode 200. The ESD protection diode 200 includes a thyristor structure.

Hereinafter, a case where first-conductivity type is n type and second-conductivity type is p type will be described as an example.

The ESD protection diode 200 includes a semiconductor layer 10, a cathode electrode 12 (first electrode), an anode electrode 14 (second electrode), a wiring layer 16 (conductive layer), and a protective insulating layer 18.

In the semiconductor layer 10, an $n^+$-type substrate region 20 (first semiconductor region), a $p^-$-type anode region 22 (second semiconductor region), an n-type cathode region 24 (third semiconductor region), a $p^+$-type first contact region 26 (fourth semiconductor region), an $n^+$-type second contact region 28, a $p^+$-type third contact region 32, a p-type first barrier region 36 (sixth semiconductor region), a buried connection layer 40 (conductor), and an insulating layer 42 are provided.

The buried connection layer 40 is provided between the substrate region 20 and a first plane P1. The buried connection layer 40 is in contact with the substrate region 20. The buried connection layer 40 penetrates, for example, the anode region 22.

The buried connection layer 40 is a conductor. The buried connection layer 40 is, for example, a metal or a semiconductor containing a conductive impurity. The buried connection layer 40 contains, for example, tungsten or titanium nitride. The buried connection layer 40 contains, for example, polycrystalline silicon containing an n-type impurity or a p-type impurity.

The insulating layer 42 is provided between the buried connection layer 40 and the semiconductor layer 10. The insulating layer 42 is provided surrounding the buried connection layer 40. The insulating layer 42 is provided, for example, between the buried connection layer 40 and the anode region 22, and between the buried connection layer 40 and the first barrier region 36.

The insulating layer 42 contains, for example, silicon oxide, silicon oxynitride, or silicon nitride.

The buried connection layer 40 and the insulating layer 42 can be manufactured by, for example, the following method.

First, a trench reaching the substrate region 20 from the first plane P1 is formed in the semiconductor layer 10, using known lithography method and reactive ion etching method (RIE method). Next, the insulating layer 42 is formed on an inner wall of the trench, using known chemical vapor deposition method (CVD method) and reactive ion etching method. Next, the trench is filled with the buried connection layer 40, using a known chemical vapor deposition method. For example, a surface of the buried connection layer 40 is planarized by a chemical mechanical polishing method (CMP method).

The wiring layer 16 is provided on the side of the first plane P1 of the semiconductor layer 10. The wiring layer 16 electrically connects the anode region 22 and the buried connection layer 40. The wiring layer 16 is in contact with, for example, the third contact region 32. The wiring layer 16 is in contact with, for example, the buried connection layer 40.

The wiring layer 16 is, for example, a metal. The wiring layer 16 contains, for example, aluminum or an aluminum alloy. A portion of the wiring layer 16, the portion being in contact with the semiconductor layer 10 and the buried connection layer 40, is provided with, for example, a barrier metal layer. The barrier metal layer contains, for example, titanium, titanium nitride, or tungsten nitride.

The ESD protection diode 200 connects the substrate region 20 and the anode region 22, using the buried connection layer 40 having a low resistance. Therefore, when a forward current flows in the ESD protection diode 200 from the anode electrode 14 to the cathode electrode 12, a large current can flow.

For example, the anode electrodes 14 of the two ESD protection diodes 200 may be connected to constitute a bi-directional ESD protection device. In this case, to reduce a dynamic resistance, reduction of a resistance when the forward current flows through the ESD protection diodes 200 is necessary.

By connecting the two ESD protection diodes 200 of the second embodiment, a bi-directional ESD protection device with a reduced dynamic resistance can be realized.

As described above, according to the second embodiment, as in the first embodiment, an ESD protection diode capable of reducing the dynamic resistance can be realized. Further, an ESD protection diode capable of reducing the chip cost can be realized. Further, an ESD protection diode with a suppressed leakage current can be realized. Furthermore, a bi-directional ESD protection device with a reduced dynamic resistance can be realized.

In the first and second embodiments, the case in which the first-conductivity type is the n type and the second-conductivity type is the p type has been described as an example. However, the first-conductivity type can be the p type and the second-conductivity type can be the n type.

While certain embodiments have been described, these embodiments have been presented by way of example only, and are not intended to limit the scope of the inventions. Indeed, a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer having a first plane and a second plane;
a first semiconductor region of a first conductivity-type provided in the semiconductor layer;
a second semiconductor region of a second conductivity-type provided in the semiconductor layer, and the second semiconductor region located between the first semiconductor region and the first plane;
a third semiconductor region of the first conductivity-type provided in the semiconductor layer, the third semiconductor region located between the second semiconductor region and the first plane, and the third semiconductor region having a lower first conductivity-type impurity concentration than the first semiconductor region;
a fourth semiconductor region of the second conductivity-type provided in the semiconductor layer, the fourth semiconductor region located between the third semiconductor region and the first plane, and the fourth semiconductor region having a higher second conductivity-type impurity concentration than the second semiconductor region;
a fifth semiconductor region of the first conductivity-type provided in the semiconductor layer, the fifth semiconductor region provided between the first semiconductor region and the first plane, and the second semiconductor region being interposed between the fifth semiconductor region and the third semiconductor region;
a first electrode provided on a side of the first plane of the semiconductor layer, and the first electrode electrically connected to the third semiconductor region and the fourth semiconductor region;
a second electrode provided on a side of the second plane of the semiconductor layer, and the second electrode electrically connected to the first semiconductor region; and
a conductive layer provided on a side of the first plane of the semiconductor layer, and the conductive layer electrically connecting the second semiconductor region and the fifth semiconductor region,
wherein the fifth semiconductor region is in direct contact with the first semiconductor region, and the fifth semiconductor region is in contact with the first plane.

2. The semiconductor device according to claim 1, further comprising:
a sixth semiconductor region of the second conductivity-type provided between the first semiconductor region and the second semiconductor region, and the sixth semiconductor region having a higher second conductivity-type impurity concentration than the second semiconductor region.

3. The semiconductor device according to claim 1, further comprising:
a seventh semiconductor region of the second conductivity-type provided between the fifth semiconductor region and the second semiconductor region, and the seventh semiconductor region having a higher second conductivity-type impurity concentration than the second semiconductor region.

4. The semiconductor device according to claim 1, wherein the first conductivity-type impurity concentration of the first semiconductor region is equal to or higher than $5\times10^{19}$ cm$^{-3}$ and equal to or lower than $5\times10^{21}$ cm$^{-3}$.

5. The semiconductor device according to claim 1, wherein a thickness in a direction from the first plane toward the second plane of the first semiconductor region is equal to or higher than 50 μm and equal to or lower than 150 μm.

6. The semiconductor device according to claim 1, wherein the second conductivity-type impurity concentration of the second semiconductor region is equal to or higher than $5\times10^{12}$ cm$^{-3}$ and equal to or lower than $1\times10^{14}$ cm$^{-3}$.

7. The semiconductor device according to claim 1, wherein the first conductivity-type impurity concentration of the fifth semiconductor region is equal to or higher than $5\times10^{16}$ cm$^{-3}$ and equal to or lower than $5\times10^{19}$ cm$^{-3}$.

8. The semiconductor device according to claim 1, wherein the conductive layer is a metal.

9. The semiconductor device according to claim 1, wherein the semiconductor layer contains silicon.

* * * * *